United States Patent
Pritchard et al.

(10) Patent No.: US 9,224,617 B2
(45) Date of Patent: Dec. 29, 2015

(54) FORMING CROSS-COUPLED LINE SEGMENTS

(71) Applicant: GLOBALFOUNDRIES Inc., Grand Cayman (KY)

(72) Inventors: David Pritchard, Glenville, NY (US); Jason E. Stephens, Cohoes, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 36 days.

(21) Appl. No.: 14/167,071

(22) Filed: Jan. 29, 2014

(65) Prior Publication Data
US 2015/0214064 A1 Jul. 30, 2015

(51) Int. Cl.
*H01L 21/8234* (2006.01)
*H01L 21/308* (2006.01)
*H01L 27/02* (2006.01)

(52) U.S. Cl.
CPC ........ *H01L 21/3088* (2013.01); *H01L 21/3086* (2013.01); *H01L 27/0207* (2013.01)

(58) Field of Classification Search
CPC ............ H01L 29/6659; H01L 21/8234; H01L 29/665; H01L 29/7833; H01L 29/666545
USPC .......................................... 438/197; 257/401
See application file for complete search history.

(56) References Cited

U.S. PATENT DOCUMENTS

| | | | | |
|---|---|---|---|---|
| 6,632,741 | B1 * | 10/2003 | Clevenger et al. | 438/689 |
| 7,611,980 | B2 * | 11/2009 | Wells et al. | 438/597 |
| 8,018,070 | B2 | 9/2011 | Blawid et al. | |
| 2009/0057743 | A1 | 3/2009 | Olligs et al. | |
| 2012/0068264 | A1 * | 3/2012 | Cheng et al. | 257/347 |
| 2015/0064916 | A1 * | 3/2015 | Shieh et al. | 438/702 |

OTHER PUBLICATIONS

Dae Han Choi et al., "Mask Formation Processing", U.S. Appl. No. 13/940,535, filed Jul. 12, 2013 (24 pages).
Xiang Hu et al., "Facilitating Mask Pattern Formation", U.S. Appl. No. 14/076,386, Nov. 11, 2013 (26 pages).

* cited by examiner

*Primary Examiner* — Phuc Dang
(74) *Attorney, Agent, or Firm* — Heslin Rothenberg Farley & Mesiti P.C.; Nicholas Mesiti, Esq.

(57) ABSTRACT

A method is provided for fabricating cross-coupled line segments for use, for instance, as a hard mask in fabricating cross-coupled gates of two or more transistors. Fabricating the structure includes: providing a sacrificial mandrel on the substrate, the sacrificial mandrel including a transverse gap through the mandrel separating the sacrificial mandrel into a first mandrel portion and a second mandrel portion; providing a sidewall spacer along sidewalls of the sacrificial mandrel, where sidewall spacers along sidewalls of the first mandrel portion and the second mandrel portion merge within the transverse gap and form a crossbar; and removing the sacrificial mandrel and selectively cutting the sidewall spacers to define the cross-coupled line segments from the sidewall spacers and crossbar. The transverse gap may be provided by directly printing the first and second mandrel portions spaced apart, or by cutting the sacrificial mandrel to provide the gap.

18 Claims, 5 Drawing Sheets

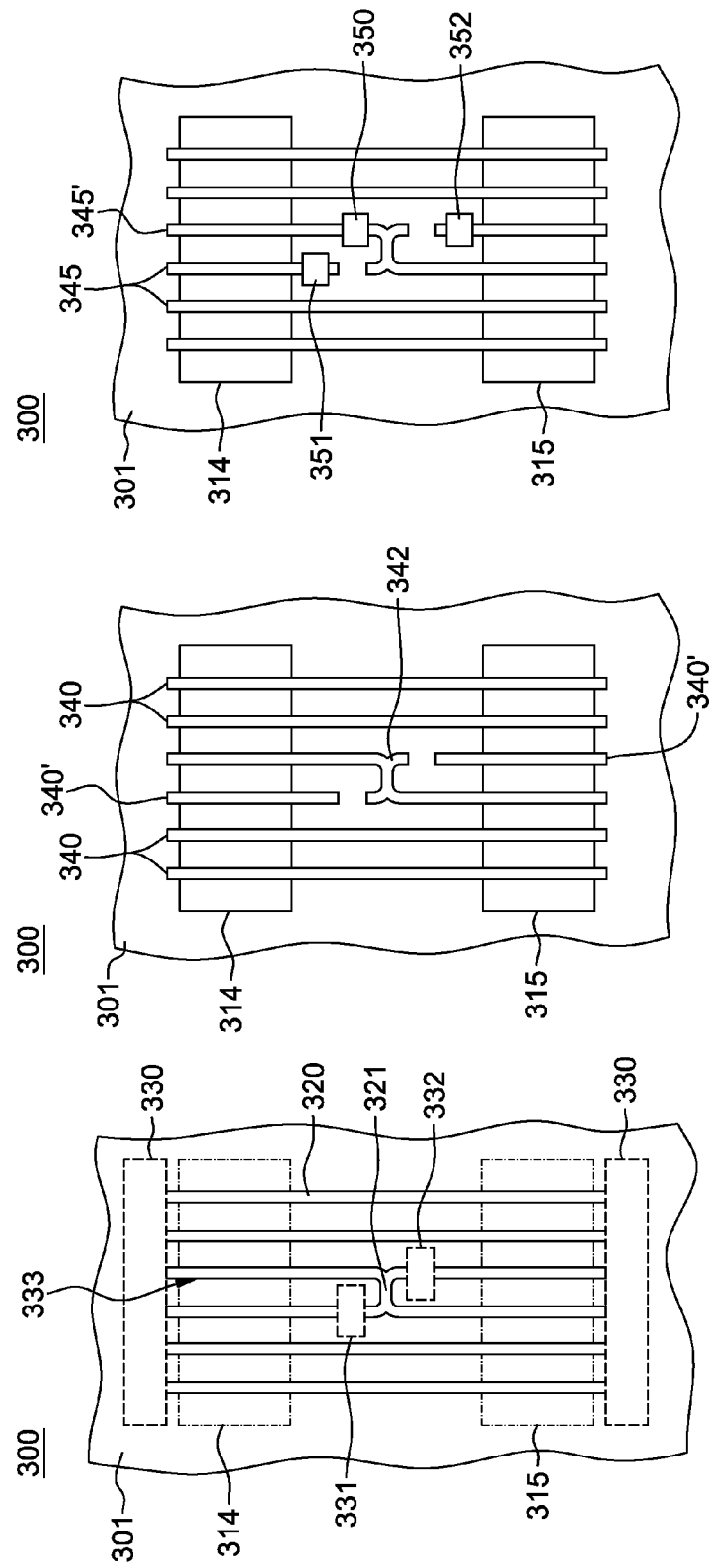

US 9,224,617 B2

FORMING CROSS-COUPLED LINE SEGMENTS

BACKGROUND OF THE INVENTION

The present invention relates in general to semiconductor devices and to methods of fabricating semiconductor devices, and more particularly, to methods of fabricating in situ masks for use, for instance, in fabricating of one or more semiconductor devices.

As is known, semiconductor device fabrication typically involves the process of transferring a mask pattern to a wafer using an etching to remove unwanted material, for instance, to facilitate forming fin structures and/or gate structures of fin-type field-effect transistors (FINFETs) or to facilitate forming field-effect transistors (FETs) in general. This process is generally referred to as lithographic processing. As the size of technology nodes continues to decrease, significant challenges continue to arise due (in part) to issues related to traditional lithographic processing techniques, including issues related to mask formation.

BRIEF SUMMARY

The shortcomings of the prior art are overcome, and additional advantages are provided through the provision, in one aspect, of a method which includes, for instance: fabricating a structure including cross-coupled line segments on a substrate, the fabricating including: providing a sacrificial mandrel on the substrate, the sacrificial mandrel including a transverse gap therethrough separating the sacrificial mandrel into a first mandrel portion and a second mandrel portion; providing a sidewall spacer along the sidewalls of the sacrificial mandrel, wherein sidewall spacers along sidewalls of the first mandrel portion and the second mandrel portion merge within the transverse gap and form a crossbar; and removing the sacrificial mandrel and selectively cutting the sidewall spacers to define the cross-coupled line segments from the sidewall spacers and the crossbar.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 3A-3F depict one embodiment of a process for fabricating an in situ mask structure including cross-coupled line segments, and the use thereof in fabricating cross-coupled gates of a plurality of transistors, in accordance with one or more aspects of the present invention.

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

In one aspect, circuit or device fabrication may involve using, for instance, lithography processing to facilitate transferring a mask pattern to one or more layers of a a semiconductor wafer, which typically includes etching the wafer using the pattern to remove unwanted material. Lithography and etch processes may be used, for instance, to facilitate forming circuit features such as gate structures, fin structures, etc. In one example, a mask structure or pattern may be fabricated in situ using a self-aligned double patterning process (also referred to as sidewall image transfer processing). As integration density and complexity of semiconductor devices increases, significant fabrications challenges continue to arise with use of traditional lithographic techniques to pattern such features.

By way of example, FIGS. 1A-1E depict one embodiment of a process for fabricating an in situ, double-patterned lithography mask for use, for instance, in fabricating one or more circuit structures or features.

Figure 1A:
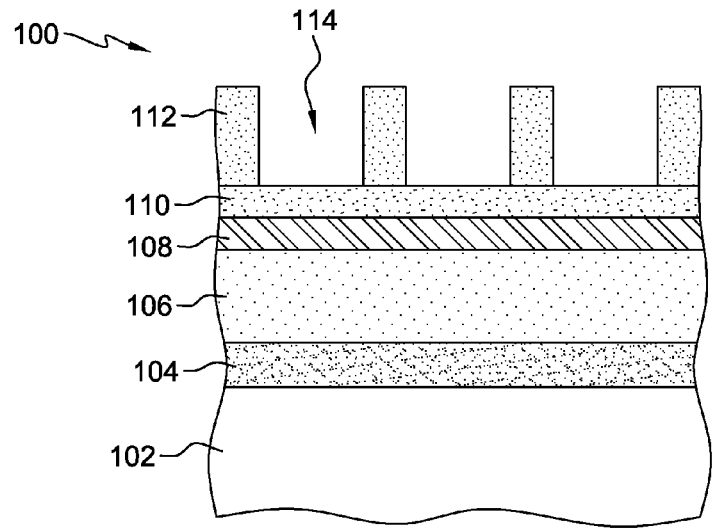
FIGS. 1A-1E depict one example of a process for fabricating an in situ mask structure for use, for instance, in facilitating fabricating one or more circuit structures.
Figure 1B:
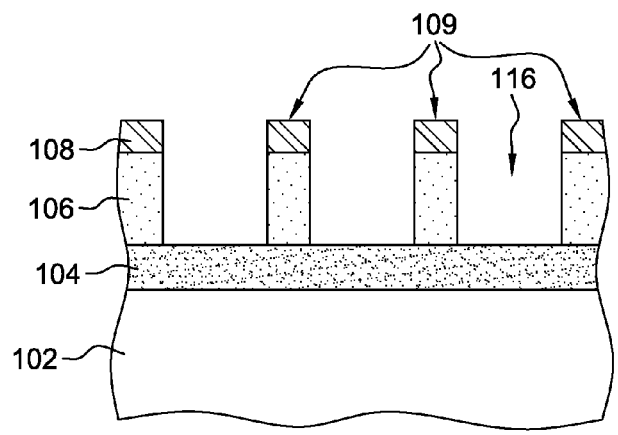

One embodiment of an intermediate structure 100 is depicted in FIG. 1A. This structure 100 includes a substrate 102, such as a semiconductor substrate (for instance, a silicon wafer), and multiple layers disposed over substrate 102. The multiple layers may include, for instance, a protective substrate mask layer 104, a sacrificial spacing layer 106 disposed over protective substrate mask layer 104 and a protective hard mask layer 108 disposed over sacrificial spacing layer 106. In one embodiment, sacrificial spacing layer 106 is a sacrificial spacing material such as, amorphous-carbon or any conventional organic material, which as understood in the art, may be employed to hold positions or form spacing for the in situ mask being formed. The noted layers of structure 100 of FIG. 1A may be formed using a variety of different materials and fabrication techniques, such as chemical vapor deposition (CVD), atomic layer deposition (ALD), physical vapor deposition (PVD) or plasma-enhanced versions of such processes. The thickness of the depicted layers may also vary, depending on the particular application.

By way of specific example, protective substrate mask layer 104 may be a layer of silicon nitride, formed over a silicon substrate 102. Together these layers define one example of a substrate structure. In this example, protective hard mask layer 108 is formed over sacrificial spacing layer 106. By way of further example, protective hard mask layer 108 may be formed of the same material as protective substrate mask layer 104, with this same material being, in one example, silicon nitride (SiN) or silicon-oxynitride (SiON) formed by CVD processing. One or more lithographic processing steps may be performed to create sacrificial spacing structures from the multi-layer structure of FIG. 1A. These lithographic processing steps may include (for instance) providing an anti-reflective coating layer 110 over protective hard mask layer 108, and providing a patterned photoresist 112 over anti-reflective coating layer 110. In one example, anti-reflective coating layer 110 may be a bottom anti-reflective coating (BARC) layer used to minimize pattern distortions due to reflections from the subsequent etching process. Patterned photoresist 112 includes openings 114, which facilitate the subsequent patterning of protective hard mask layer 108.

One or more lithographic etching processes are performed to transfer the pattern from patterned photoresist 112 of FIG. 1A to the protective hard mask layer 108. These process operations may include, for example, an anti-reflective-coating open step and a hard-mask open step. A final etch step is performed to obtain the structure depicted in FIG. 1B, in which the patterned photoresist layer and anti-reflective coating layer of the structure of FIG. 1A have been removed and the sacrificial spacing layer 106 (e.g., amorphous-carbon) has been etched to define a pattern of sacrificial spacing structures 109. As shown, sacrificial spacing structures 109, which may be separated by spaces 116, may include protective hard masks 108 (disposed at the upper surfaces thereof) over sacrificial spacing layer or material 106.

Figure 1C:
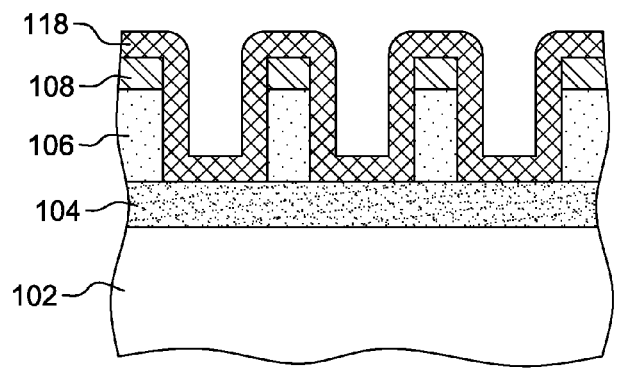

As depicted in FIG. 1C, a sidewall spacer layer 118 is conformally provided over sacrificial spacing structures 109 and the substrate structure. Note that, in one embodiment, sidewall spacer layer 118 may be fabricated of a material that is substantially similar to the material defining protective hard masks 108 and/or protective substrate mask 104. In one example, sidewall spacer layer 118 may include, for instance, a nitride (such as, for example, $Si_3N_4$ or SiN), conformally deposited using any of a variety of techniques, such as, for example, chemical vapor deposition (CVD) or atomic layer deposition (ALD).

Figure 1D:
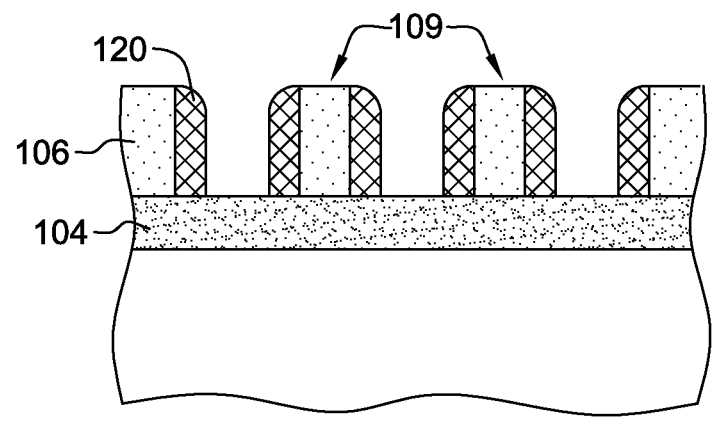

As illustrated in FIG. 1D, the sidewall spacer layer is etched, for instance, by any appropriate non-selective etching process, to form sidewall spacers 120, along the sidewalls of sacrificial spacing structures 109. As a part of this one-step etch process, the protective hard mask layer 108 (see FIG. 1C) is removed, and the sidewall spacer layer is also etched from above protective substrate mask 104, between sacrificial spacing structures 109, resulting in exposing underlying protective substrate mask 104.

Figure 1E:
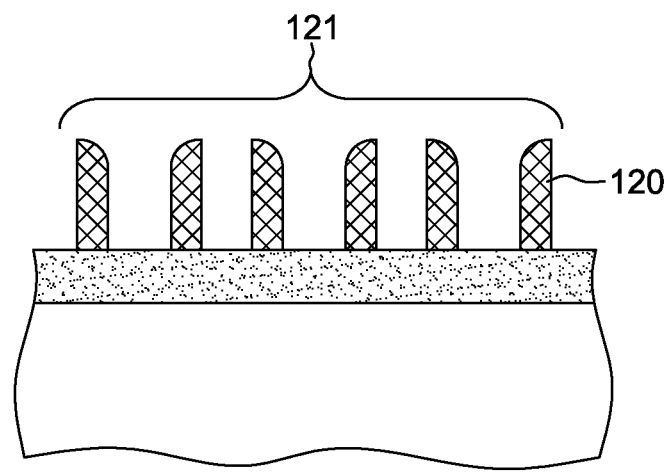

Sacrificial spacing material/layer 106 (see FIG. 1D) is subsequently etched away, as depicted in FIG. 1E, by selective etch processing to create an in situ mask pattern 121 from the remaining sidewall spacers 120. The mask pattern 121 created via this sidewall image transfer processing can then be employed in forming one or more structures within the substrate or wafer, such as gate structures or fin structures, of a circuit structure.

Figure 2:
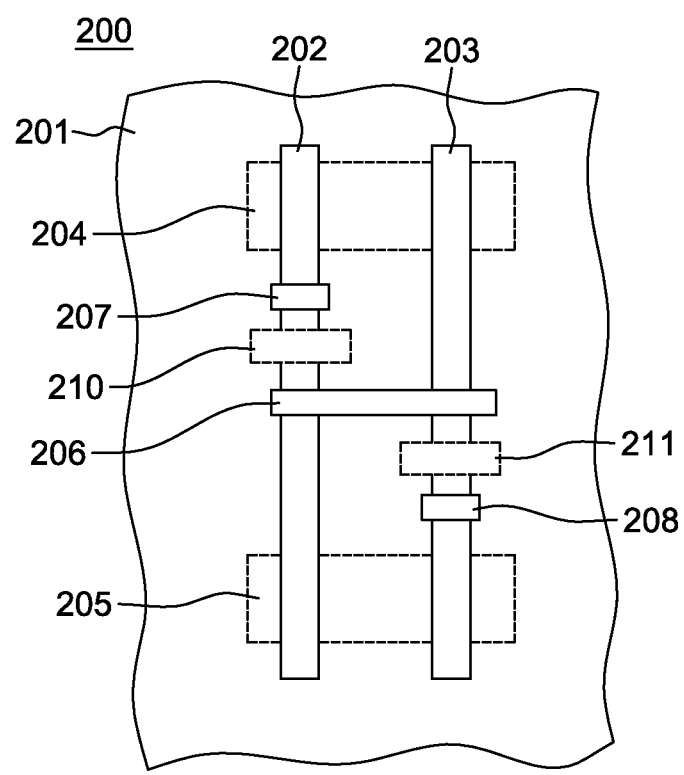
FIG. 2 depicts one example of a resultant circuit structure, with gates of adjacent transistors cross-coupled via a bridging electrical contact extending between the adjacent gates, in accordance with one or more aspects of the present invention.

By way of example, FIG. 2 depicts one embodiment of a circuit structure 200 (or cell design) with cross-coupled gates electrically connected across the pitch. In particular, circuit structure 200 includes a substrate 201, such as a semiconductor substrate or wafer, with parallel-extending, adjacent gates 202, 203 of a plurality of transistors disposed, for instance, within multiple active device regions 204, 205 of the circuit structure. In this embodiment, gates 202, 203 are electrically connected or cross-coupled via a bridging electrical contact 206 formed between the gates 202, 203. Additionally, selective cuts 210, 211 are provided in gates 202, 203, respectively, to segment the gates, and electrical contacts 207, 208 are made to the remaining gate segments. Note that the circuit structure depicted in FIG. 2 is limited currently to middle-of-line (MOL) process integration, and potential implementations might require either novel materials, or more mask layers or contact stitching as gate pitch continues to decrease, which may be problematic for proper integration into the circuit fabrication flow. The circuit structure of FIG. 2 would be particularly difficult to implement for technology nodes below 20 nm due to the need for the added connector.

Disclosed herein with reference to FIGS. 3A-3F is another approach for forming cross-coupled gates using a modified version of the above-discussed self-aligned, double-patterning process. In this modified flow, cross-coupled line segments are directly created in situ during formation of the self-aligned, double-pattern mask, thus advantageously avoiding the integration issues with the approach depicted in FIG. 2.

Figure 3C:
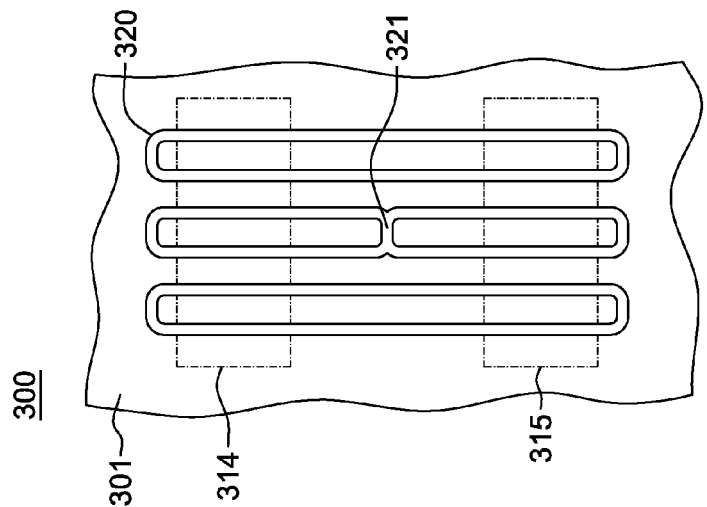
Figure 3B:
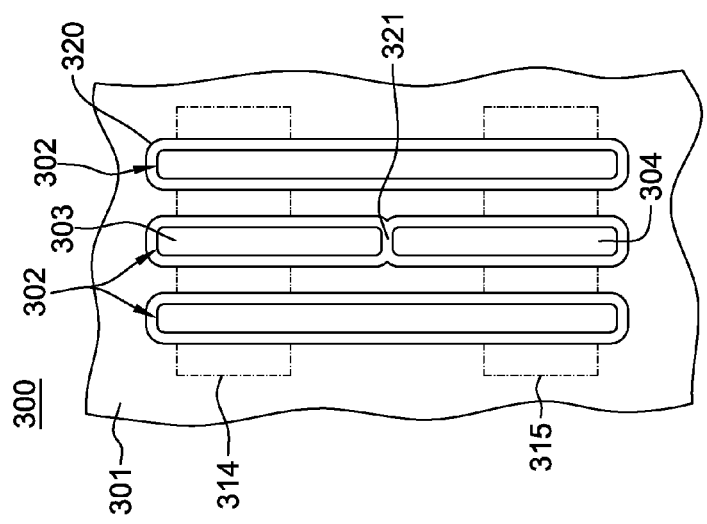
Figure 3A:
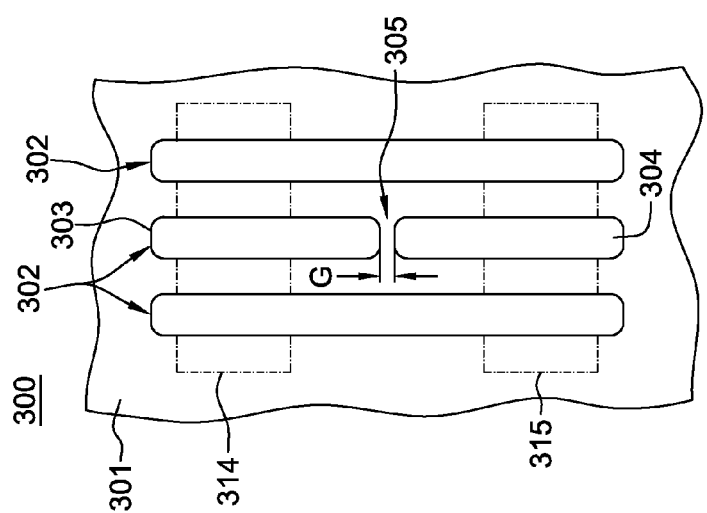

Referring to FIG. 3A, one embodiment of a circuit or wafer 300 is depicted. In the intermediate stage shown, wafer 300 includes, for instance, a semiconductor substrate 301, which may include as part of the substrate polysilicon material, and one or more active device regions 314, 315 formed (or to be formed) within wafer 300. A plurality of parallel-extending, elongate sacrificial mandrels 302 have been provided on substrate 301. These elongate sacrificial mandrels 302 may be of any desired shape, length, width, etc., for the particular application of sidewall image transfer processing desired. In one example, the elongate sacrificial mandrels 302 may be formed as lines which extend across a significant portion of wafer 300 and overlie many active device regions, with active device regions 314, 315 being shown by way of example only.

Referring collectively to FIGS. 3A & 3B, one sacrificial mandrel 302 is shown to include a transverse gap G 305 therethrough, separating or segmenting the sacrificial mandrel into a first mandrel portion 303 and a second mandrel portion 304. The width of transverse gap G 305 is controlled, and is selected with reference to the thickness of a sidewall spacer 320 (FIG. 3B) formed around the sacrificial mandrels 302 using, for instance, conformal deposition, and etch processing, similar to that described above in connection with FIGS. 1C-1E.

Forming transverse gap G 305 of desired width in the sacrificial mandrel may involve directly forming the first mandrel portion and the second mandrel portion of the sacrificial mandrel with adjacent ends thereof spaced apart to define the transverse gap G. For instance, the broken or segmented sacrificial mandrel may be directly printed onto substrate 301 using, for instance, lithography processing. Alternatively, a gap of desired width may be formed by providing the sacrificial mandrel on the substrate, and then cutting the sacrificial mandrel transversely to define transverse gap G 305 through the mandrel, for instance, using a special mandrel cut mask with an opening sized to the desired width of transverse gap G.

Note that although described herein with reference to providing a single sacrificial mandrel 302 with transverse gap G, the process may be repeated any number of times across the same mandrel or different mandrels in the same or different regions of the wafer 300, as desired to obtain different configurations of an in situ mask having line segments and cross-coupled line segments, for instance, to implement a desired gate configuration for a plurality of transistors of a device, such as a microprocessor, memory circuit, optoelectronic circuit, electro-mechanical circuit, etc. In one specific example, the cross-coupled line segments (or resultant cross-coupled gates) disclosed herein could be employed in forming a standard cell design, such as for a flip-flop, which may be replicated, for instance, a large number of times in a memory circuit or device being fabricated.

By way of example, sidewall spacer 320 may include an oxide, or a nitride, such as, for example, $Si_3N_4$, or $Si_N$, conformally deposited using any of a variety of techniques, such as, for example, chemical-vapor deposition (CVD) or atomic layer deposition (ALD). The conformally deposited sidewall spacer layer is etched using any appropriate non-selective etching process to form the resultant sidewall spacers 320, for instance, in a manner similar to that described above. As one example, sidewall spacers 320 may have a thickness in a range of 20 to 30 nanometers, and the width of transverse gap G 305 is controlled or defined to be, in one example, approximately twice the thickness of the sidewall spacer 320. Alternatively, the width of transverse gap G may be less than twice the thickness of the sidewall spacer to ensure merging of the sidewall spacer within the transverse gap. The sidewall merging results in formation of a crossbar 321 within the transverse gap cross-coupling line segments on different sides of the first and second mandrel portions 303, 304, as illustrated in FIG. 3B.

Continuing with FIGS. 3C-3F, the sidewall spacer pattern, with the formed "X" shape or crossbar 321 in the one sidewall spacer (or hard mask) is transferred to the wafer by, for instance, selectively removing the sacrificial mandrels 302 (see FIGS. 3A & 3B), leaving the mask pattern illustrated in FIG. 3C, and then using a cut mask with patterned openings to facilitate cutting 330 the rounded ends of the sidewall spacers to form the desired hard mask line segments, as well as optionally form openings or discontinuities 331, 332 in selected line segments diagonally disposed across crossbar 321, in order to define one or more cross-coupled line segments 333. Note that openings or discontinuities 331, 332 are provided by way of example only. In other implementations, one such opening or discontinuity may be provided in one of the line segments, or even no such openings or discontinuities 331, 332 may be provided, again, depending on the desired implementation for the line segments. The patterned wafer 300 is depicted in FIG. 3E, which may be obtained by using the hard mask of FIG. 3D to selectively, anisotropically etch, for instance, underlying polysilicon on or within substrate 301 to define polysilicon lines 340 and cross-coupled lines 340', for instance, as part of a gate-last or replacement metal gate process flow. The polysilicon lines include unbroken gate lines 340, and truncated gate lines 340', as well as one or more cross-coupled gates 342. Once final gates 345, 345' are formed, electrical contacts 350, 351, 352, etc., may be formed to the circuit structure.

Note that the electrical contact 350 to cross-coupled gate 345' may be offset from the location of the crossbar (see FIGS. 3B-3D) connecting adjacent lines across the gate pitch. This electrical contact may advantageously be substantially identical to other electrical contacts, such as electrical contacts 351, 352, made to the depicted gate structures. Thus, electrical contact may be provided using conventional processing, without the use of any special contact layer, such as would be the case with the circuit structure of FIG. 2. Advantageously, with the processing described hereinabove with reference to FIGS. 3A-3F, it is possible to directly connect, for instance, polysilicon lines as one continuous structure using a merged crossbar. This process also advantageously results in reducing spacing between adjacent active device regions by facilitating formation of a smaller crossbar, that is, in comparison with an approach as described above in connection with FIG. 2. Thus, gate density for the resultant integrated circuit chip may be reduced, while also saving mask steps, and making it easier to place contacts to the resultant gate structures. There is no need for a bridging contact in the embodiment described above, thereby providing more flexibility in circuit design, for instance, in overlying a metal layer above the circuit structures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a structure comprising cross-coupled line segments on a substrate, the fabricating comprising:
        providing a sacrificial mandrel on the substrate, the sacrificial mandrel comprising a transverse gap therethrough separating the sacrificial mandrel into a first mandrel portion and a second mandrel portion;
        providing a sidewall spacer along sidewalls of the sacrificial mandrel, wherein sidewall spacers along sidewalls of the first mandrel portion and the second mandrel portion merge within the transverse gap and form a crossbar;
        removing the sacrificial mandrel and selectively cutting the sidewall spacers to define the cross-coupled line segments from the sidewall spacers and the crossbar;
        wherein providing the sacrificial mandrel comprises lithographically forming a plurality of parallel-extending, elongate sacrificial mandrels on the substrate, the sacrificial mandrel being one elongate sacrificial mandrel of the plurality of parallel-extending, elongate sacrificial mandrels; and
        wherein providing the one elongate sacrificial mandrel comprises directly lithographically printing the first mandrel portion and the second mandrel portion on with the substrate, with adjacent ends thereof spaced apart to define the transverse gap through the sacrificial mandrel.

2. The method of claim 1, wherein providing the sacrificial mandrel comprises directly forming the first mandrel portion and the second mandrel portion on the substrate with adjacent ends thereof spaced apart to define the transverse gap through the sacrificial mandrel.

3. The method of claim 2, wherein the transverse gap comprises a width which is approximately twice a thickness of the sidewall spacer, or less.

4. The method of claim 1, wherein providing the sacrificial mandrel comprises forming the sacrificial mandrel on the substrate and cutting the sacrificial mandrel to provide the transverse gap therethrough.

5. The method of claim 4, wherein the transverse gap comprises a width which is approximately twice a thickness of the sidewall spacer, or less.

6. The method of claim 1, wherein the transverse gap comprises a width which is approximately twice a thickness of the sidewall spacer.

7. The method of claim 1, wherein providing the sacrificial mandrel comprises lithographically forming the sacrificial mandrel on the substrate, the substrate comprising a semiconductor wafer.

8. The method of claim 7, wherein the sidewall spacer is a hard mask and the fabricating further comprises patterning at least a portion of the substrate using the cross-coupled line segments.

9. The method of claim 8, wherein the sidewall spacer comprises a nitride or an oxide.

10. The method of claim 8, wherein the substrate comprises polysilicon and the fabricating comprises patterning the polysilicon using, at least in part, the cross-coupled line segments.

11. The method of claim 1, wherein the transverse gap comprises a width which is approximately twice a thickness of the sidewall spacer, or less.

12. A method comprising:
fabricating a structure comprising cross-coupled line segments on a substrate, the fabricating comprising:
providing a sacrificial mandrel on the substrate, the sacrificial mandrel comprising a transverse gap therethrough separating the sacrificial mandrel into a first mandrel portion and a second mandrel portion;
providing a sidewall spacer along sidewalls of the sacrificial mandrel, wherein sidewall spacers along sidewalls of the first mandrel portion and the second mandrel portion merge within the transverse gap and form a crossbar;
removing the sacrificial mandrel and selectively cutting the sidewall spacers to define the cross-coupled line segments from the sidewall spacers and the crossbar;
wherein providing the sacrificial mandrel comprises lithographically forming a plurality of parallel-extending, elongate sacrificial mandrels on the substrate, the sacrificial mandrel being one elongate sacrificial mandrel of the plurality of parallel-extending, elongate sacrificial mandrels; and
wherein providing the one elongate sacrificial mandrel comprises lithographically forming the one elongate sacrificial mandrel on the substrate, and subsequently cutting the one elongate sacrificial mandrel to provide the transverse gap therethrough.

13. The method of claim 12, wherein the transverse gap comprises a width which is approximately twice a thickness of the sidewall spacer, or less.

14. A method comprising:
fabricating a structure comprising cross-coupled line segments on a substrate, the fabricating comprising:
providing a sacrificial mandrel on the substrate, the sacrificial mandrel comprising a transverse gap therethrough separating the sacrificial mandrel into a first mandrel portion and a second mandrel portion;
providing a sidewall spacer along sidewalls of the sacrificial mandrel, wherein sidewall spacers along sidewalls of the first mandrel portion and the second mandrel portion merge within the transverse gap and form a crossbar;
removing the sacrificial mandrel and selectively cutting the sidewall spacers to define the cross-coupled line segments from the sidewall spacers and the crossbar;
wherein the selectively cutting comprises forming a first cut through the sidewall spacer provided along the first mandrel portion and a second cut through the sidewall spacer provided along the second mandrel portion, the first cut and the second cut being on opposite sides of the sacrificial mandrel.

15. The method of claim 14, further comprising using the cross-coupled line segments as a mask in forming cross-coupled gates of a plurality of transistors.

16. The method of claim 15, wherein the fabricating further comprises forming an electrical contact to the cross-coupled gates at a location offset from a location of the crossbar.

17. The method of claim 15, wherein the fabricating further comprises forming a single electrical contact to the cross-coupled gates at a location, the location being offset from a location of the crossbar.

18. The method of claim 15, wherein the fabricating further comprises forming a plurality of transistors, and wherein the cross-coupled line segments facilitate forming cross-coupled gates of the plurality of transistors.

* * * * *